US 6,693,428 B2

(12) United States Patent
Udo et al.

(10) Patent No.: US 6,693,428 B2
(45) Date of Patent: Feb. 17, 2004

(54) RF COIL AND MAGNETIC RESONANCE IMAGING APPARATUS

(75) Inventors: Yoshiro Udo, Tokyo (JP); Akira Izuhara, Tokyo (JP)

(73) Assignee: GE Medical Systems Global Technology Company, LLC, Waukesha, WI (US)

(*) Notice: Subject to any disclaimer, the term of this patent is extended or adjusted under 35 U.S.C. 154(b) by 0 days.

(21) Appl. No.: 10/271,260

(22) Filed: Oct. 15, 2002

(65) Prior Publication Data

US 2003/0076102 A1 Apr. 24, 2003

(30) Foreign Application Priority Data

Oct. 24, 2001 (JP) .......................... 2001-325811

(51) Int. Cl.[7] .................................................. G01V 3/00
(52) U.S. Cl. ................... 324/318; 324/322; 324/321; 324/389; 324/314
(58) Field of Search ................ 324/318, 322, 324/321, 309, 307, 314; 600/407, 410; 156/270.8; 128/653.5

(56) References Cited

U.S. PATENT DOCUMENTS

| 4,506,224 | A | 3/1985 | Krause .................. 324/319 |
| 4,592,363 | A | 6/1986 | Krause .................. 128/653 |
| 4,897,604 | A | 1/1990 | Carlson et al. ............ 324/318 |
| 5,327,898 | A | 7/1994 | Yoshino et al. .......... 128/653.5 |
| 5,594,339 | A | 1/1997 | Henderson et al. ......... 324/318 |
| 5,696,449 | A | 12/1997 | Boskamp .................. 324/318 |
| 5,699,802 | A | 12/1997 | Duerr .................... 128/653.5 |
| 5,777,474 | A | 7/1998 | Srinivasan ................ 324/318 |
| 6,141,580 | A | 10/2000 | Hayashi et al. ............ 324/318 |
| 6,169,400 | B1 | 1/2001 | Sakuma .................... 324/318 |
| 6,194,900 | B1 * | 2/2001 | Freeman et al. ........... 324/321 |
| 6,297,636 | B1 | 10/2001 | Shimo et al. .............. 324/318 |

* cited by examiner

Primary Examiner—Diego Gutierrez
Assistant Examiner—Brij B. Shrivastav
(74) Attorney, Agent, or Firm—Carl B. Horton, Esq.; Armstrong Teasdale LLP

(57) ABSTRACT

For the purpose of providing an RF coil that prevents a troublesome force from arising when a hanging portion is lifted up, a pair of handhold members 308 is provided along a side that corresponds to an inner side of a cylinder 110, each member extending from one end to the other end of one of a pair of flexible substrates 304 so that an operator can lift the hanging portion up using such handhold member.

24 Claims, 14 Drawing Sheets

RF COIL AND MAGNETIC RESONANCE IMAGING APPARATUS

CROSS REFERENCE TO RELATED APPLICATIONS

This application claims the benefit of Japanese Application No. 2001-325811 filed Oct. 24, 2001.

BACKGROUND OF THE INVENTION

The present invention relates to an RF (radio frequency) coil and a magnetic resonance imaging apparatus, and particularly to an RF coil disposed proximate to and surrounding a subject to be imaged, and a magnetic resonance imaging apparatus employing such an RF coil.

In a magnetic resonance imaging apparatus, an RF coil is disposed proximate to and surrounding a subject to be imaged so that magnetic resonance signals are measured as close to a region to be imaged as possible to improve the SNR (signal-to-noise ratio) of the signals.

A representative example of such an RF coil is a cylindrical RF coil for inserting the subject's head, i.e., a head coil. In a magnetic resonance imaging apparatus employing a magnetic field of a strength as low as 0.2 T or 0.5 T, for example, such an RF coil is also employed for imaging the subject's trunk. In this case, the RF coil is constructed to be developable. The developed RF coil is placed on an imaging table, the subject is rested over the developed RF coil, and finally the developed portion of the RF coil is closed to form the cylinder.

Since the RF coil having the aforementioned configuration hangs down on the right and left sides of the subject to be imaged due to gravity in its developed condition, an operator lifts the hanging portions up by the hands to wrap the subject to be imaged from both sides.

Generally, the work is done with the operator on one side of the subject, and he/she must stretch his/her hand over the subject to the opposite side to lift the hanging portion. At that time, the proximal portion that lies near at hand is often lifted up by one hand, and therefore, stress is concentrated at the proximal portion, possibly resulting in breakage over the repeated work.

SUMMARY OF THE INVENTION

It is therefore an object of the present invention to provide an RF coil that prevents a troublesome force from arising when the hanging portion is lifted up, and a magnetic resonance imaging apparatus comprising such an RF coil. Another object of the present invention is to provide an RF coil that offers good workability for the lifting up of the hanging portion, and a magnetic resonance imaging apparatus comprising such an RF coil.

(1) The present invention, in one aspect thereof for solving the aforementioned problem, is an RF coil characterized in comprising: a base member; a pair of flexible substrates each having an electric circuit for the RF coil, one end of each flexible substrate being attached to a lateral side of said base member, the other ends of the flexible substrates being coupled to each other via a coupling member to form a cylinder; a shape defining member attached to a side of said pair of flexible substrates that corresponds to an inner side of said cylinder, for defining a curved shape of said pair of flexible substrates when said cylinder is formed; and a pair of handhold members each provided along a side that corresponds to an inner side of said shape defining member in said cylinder, each handhold member extending from one end to the other end of one of said pair of flexible substrates.

(2) The present invention, in another aspect thereof for solving the aforementioned problem, is an RF coil characterized in comprising: a base member; a pair of flexible substrates each having an electric circuit for the RF coil, one end of each flexible substrate being attached to a lateral side of said base member, the other ends of the flexible substrates being coupled to each other via a coupling member to form a cylinder; a shape defining member attached to a side of said pair of flexible substrates that corresponds to an inner side of said cylinder, for defining a curved shape of said pair of flexible substrates when said cylinder is formed; a sheet member provided along a side that corresponds to an inner side of said shape defining member in said cylinder, extending from one end to the other end of each of said pair of flexible substrates; and a pair of handhold members each provided along a side that corresponds to an inner side of said sheet member in said cylinder, each handhold member extending from one end to the other end of one of said pair of flexible substrates.

(3) The present invention, in still another aspect thereof for solving the aforementioned problem, is magnetic resonance imaging apparatus having: static magnetic field generating means for generating a static magnetic field in a space for receiving a subject to be imaged, gradient magnetic field generating means for generating a gradient magnetic field in said space, high frequency magnetic field generating means for generating a high frequency magnetic field in said space, measuring means for measuring magnetic resonance signals from said subject, and image producing means for producing an image based on said magnetic resonance signals, wherein said measuring means has an RF coil, said RF coil characterized in comprising: a base member; a pair of flexible substrates each having an electric circuit for the RF coil, one end of each flexible substrate being attached to a lateral side of said base member, the other ends of the flexible substrates being coupled to each other via a coupling member to form a cylinder; a shape defining member attached to a side of said pair of flexible substrates that corresponds to an inner side of said cylinder, for defining a curved shape of said pair of flexible substrates when said cylinder is formed; and a pair of handhold members each provided along a side that corresponds to an inner side of said shape defining member in said cylinder, each handhold member extending from one end to the other end of one of said pair of flexible substrates.

(4) The present invention, in still another aspect thereof for solving the aforementioned problem, is a magnetic resonance imaging apparatus having: static magnetic field generating means for generating a static magnetic field in a space for receiving a subject to be imaged, gradient magnetic field generating means for generating a gradient magnetic field in said space, high frequency magnetic field generating means for generating a high frequency magnetic field in said space, measuring means for measuring magnetic resonance signals from said subject, and image producing means for producing an image based on said magnetic resonance signals, wherein said measuring means has an RF coil, said RF coil characterized in comprising: a base member; a pair of flexible substrates each having an electric circuit for the RF coil, one end of each flexible substrate being attached to a lateral side of said base member, the other ends of the flexible substrates being coupled to each other via a coupling member to form a cylinder; a shape defining member attached to a side of said pair of flexible substrates that corresponds to an inner side of said cylinder, for defining a curved shape of said pair of flexible substrates when said cylinder is formed; a sheet member provided along a side that corresponds to an inner side of said shape defining member in said cylinder, extending from one end to the other end of each of said pair of flexible substrates; and a pair of handhold members each provided along a side that corresponds to an inner side of said sheet member in said cylinder, each handhold member extending from one end to the other end of one of said pair of flexible substrates.

In the invention of the aspects described regarding (1)–(4), since a pair of handhold members is provided along a side that corresponds to an inner side of the cylinder, each of which members extends from one end to the other end of one of the pair of flexible substrates, the operator can lift the hanging portion using the handhold members. Thus, the hanging portion is prevented from application of a troublesome force, and moreover, the workability is improved.

Preferably, the handhold member is an elongated flexible element with one end fixed to one end of the flexible substrate and the other end fixed to the other end of the flexible substrate, so that the lifting-up can be done easily.

Preferably, the handhold member has one end fixed to a central portion of one end of the flexible substrate and the other end fixed to a central portion of the other end of the flexible substrate, so that the lifting-up is done in good balance.

Preferably, the handhold member of the flexible element has a length greater than the length of the flexible substrate so that the hanging is not hindered.

Preferably, the handhold member is a band-like element so that the weight applied to the operator's hand can be dispersed. Such handhold member is also preferable in that it is thin and it does not occupy a large space in the interior of the RF coil.

Preferably, the handhold member is a cord-like element so that the usage of material is reduced.

Preferably, the handhold member is a string-like element so that the usage of material is further reduced.

Preferably, the handhold member is a chain-like element so that it is stout.

Therefore, the present invention can provide an RF coil that prevents a troublesome force from arising when the hanging portion is lifted up, and a magnetic resonance imaging apparatus comprising such an RF coil. Moreover, the present invention can provide an RF coil that offers good workability for the lifting up of the hanging portion, and a magnetic resonance imaging apparatus comprising such an RF coil.

Further objects and advantages of the present invention will be apparent from the following description of the preferred embodiments of the invention as illustrated in the accompanying drawings.

DETAILED DESCRIPTION OF THE INVENTION

Figure 1:
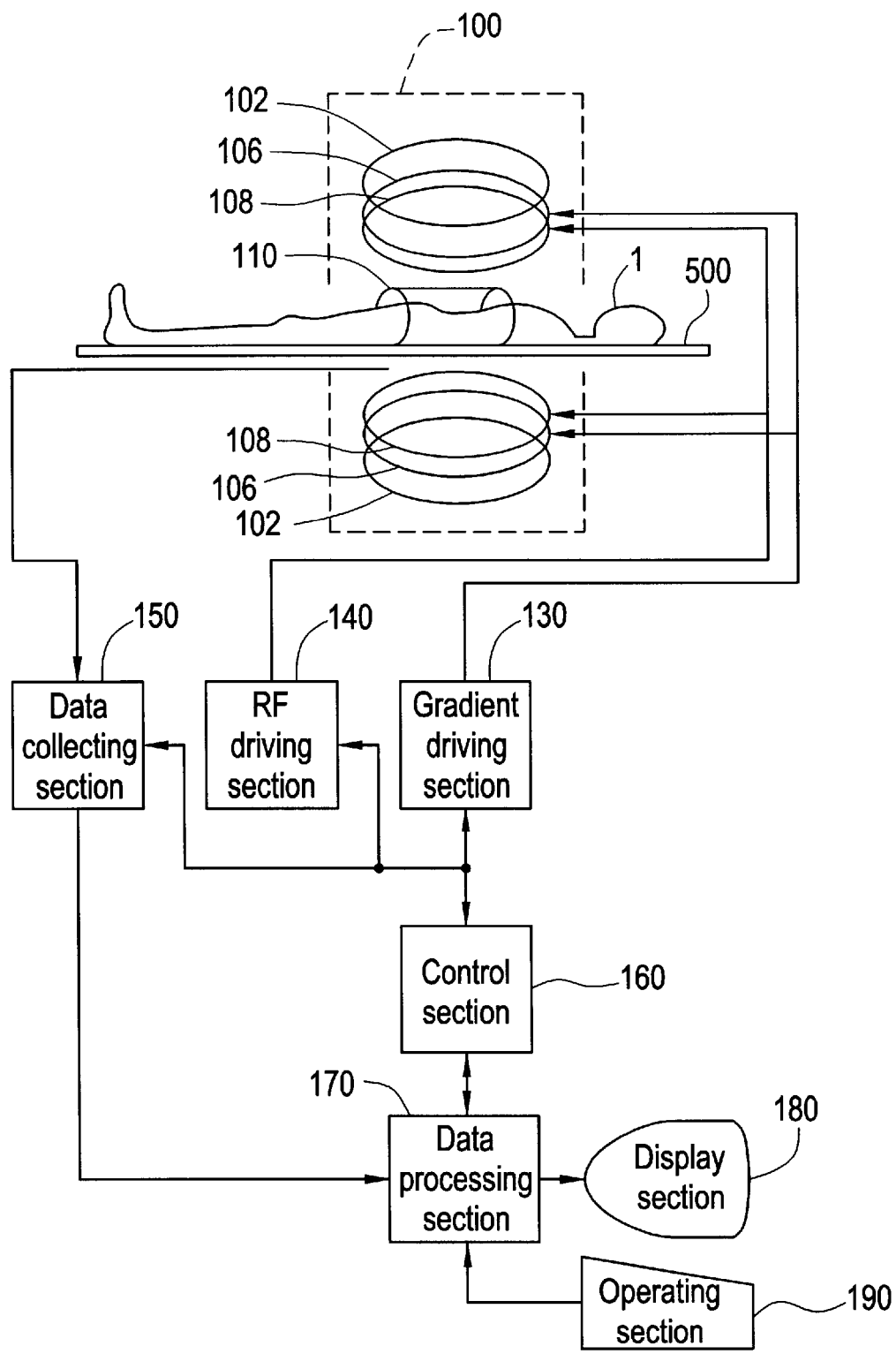
FIG. 1 is a block diagram of an apparatus in accordance with one embodiment of the present invention.

Several embodiments of the present invention will now be described in detail with reference to the accompanying drawings. FIG. 1 is a block diagram of a magnetic resonance imaging apparatus, which is one embodiment of the present invention. The configuration of the apparatus represents an embodiment of the apparatus in accordance with the present invention.

As shown in FIG. 1, the present apparatus has a magnet system 100. The magnet system 100 has a main magnetic field magnet section 102, a gradient coil section 106, and a transmit coil section 108. The main magnetic field magnet section 102, gradient coil section 106 and transmit coil section 108 each comprise a pair of members facing each other across a space. These sections have a generally disk-like shape and are disposed to have a common center axis. The main magnetic field magnet section 102 is an embodiment of the static magnetic field generating means of the present invention.

A subject 1 is rested on a cradle 500 and carried into and out of the internal space (bore) of the magnet system 100 by carrier means, which is not shown. The trunk of the subject 1 is received within a cylindrical receive coil section 110.

The receive coil section 110 is an embodiment of the RF coil of the present invention. The configuration of the coil represents an embodiment of the RF coil in accordance with the present invention. The receive coil section 110 will be described in more detail later.

The main magnetic field magnet section 102 generates a static magnetic field in the internal space of the magnet system 100. The direction of the static magnetic field is generally orthogonal to the direction of the body axis of the subject 1. That is, a so-called vertical magnetic field is generated. The main magnetic field magnet section 102 is constructed using a permanent magnet, for example. It will be easily recognized that the main magnetic field magnet section 102 is not limited to a permanent magnet, but may be made using a super or normal conductive electromagnet or the like.

The gradient coil section 106 generates three gradient magnetic fields for imparting respective gradients to the static magnetic field strength in directions of three mutually perpendicular axes, i.e., slice axis, phase axis, and frequency axis.

When mutually perpendicular coordinate axes in the static magnetic field space are represented as x, y, and z, any one of the axes can be the slice axis. In this case, one of the two remaining axes is the phase axis and the other is the frequency axis. Moreover, the slice, phase, and frequency axes can be given arbitrary inclination with respect to the x-, y-, and z-axes while maintaining their mutual perpendicularity.

The gradient magnetic field in the slice axis direction is sometimes referred to as the slice gradient magnetic field. The gradient magnetic field in the phase axis direction is sometimes referred to as the phase encoding gradient magnetic field. The gradient magnetic field in the frequency axis direction is sometimes referred to as the readout gradient magnetic field. In order to enable generation of such gradient magnetic fields, the gradient coil section 106 has three gradient coils, which are not shown. The gradient magnetic field will be sometimes referred to simply as the gradient hereinbelow.

The RF coil section 108 generates a high frequency magnetic field for exciting spins within the subject 1 in the static magnetic field space. The generation of the high frequency magnetic field will be sometimes referred to as transmission of the RF excitation signals hereinbelow. Moreover, the RF excitation signal will be sometimes referred to as an RF pulse. The receive coil section 110 receives electromagnetic waves generated by the excited spins, i.e., magnetic resonance signals.

The gradient coil section 106 is connected with a gradient driving section 130. The gradient driving section 130 supplies driving signals to the gradient coil section 106 to generate the gradient magnetic fields. The gradient driving section 130 has three driving circuits, which are not shown, corresponding to the three gradient coils in the gradient coil section 106. A portion comprised of the gradient coil section 106 and gradient driving section 130 is an embodiment of the gradient magnetic field generating means of the present invention.

The RF coil section 108 is connected with an RF driving section 140. The RF driving section 140 supplies driving signals to the RF coil section 108 to transmit the RF pulse, thereby exciting the spins within the subject 1. A portion comprised of the RF coil section 108 and RF driving section 140 is an embodiment of the high frequency magnetic field generating means of the present invention.

The receive coil section 110 is connected to a data collecting section 150. The data collecting section 150 gathers receive signals received by the receive coil section 110 by sampling them, and collects the signals as digital data. A portion comprised of the receive coil section 110 and data collecting section 150 is an embodiment of the measuring means of the present invention.

The gradient driving section 130, RF driving section 140 and data collecting section 150 are connected with a control section 160. The control section 160 controls the gradient driving section 130, RF driving section 140 and data collecting section 150 to carry out imaging.

The control section 160 is constructed using, for example, a computer. The control section 160 has a memory, which is not shown. The memory stores programs for the control section 160 and several kinds of data. The function of the control section 160 is achieved by the computer executing a program stored in the memory.

The output of the data collecting section 150 is connected to a data processing section 170. The data collected by the data collecting section 150 is input to the data processing section 170. The data processing section 170 is constructed using, for example, a computer. The data processing section 170 has a memory, which is not shown. The memory stores programs for the data processing section 170 and several kinds of data.

The data processing section 170 is connected to the control section 160. The data processing section 170 is above the control section 160 and controls it. The function of the present apparatus is achieved by the data processing section 170 executing a program stored in the memory.

The data processing section 170 stores data collected by the data collecting section 150 into the memory. A data space is formed in the memory. The data space constitutes a two-dimensional Fourier space. The Fourier space will be sometimes referred to as a k-space hereinbelow. The data processing section 170 performs a two-dimensional inverse Fourier transformation on the data in the k-space to reconstruct an image of the subject 1. The data processing section 170 is an embodiment of the image producing means of the present invention.

The data processing section 170 is connected with a display section 180 and an operating section 190. The display section 180 comprises a graphic display, etc. The operating section 190 comprises a keyboard, etc., provided with a pointing device.

The display section 180 displays the reconstructed image and several kinds of information output from the data processing section 170. The operating section 190 is operated by a user, and the section 190 inputs several commands, information and so forth to the data processing section 170. The user interactively operates the present apparatus via the display section 180 and operating section 190.

Figure 2:
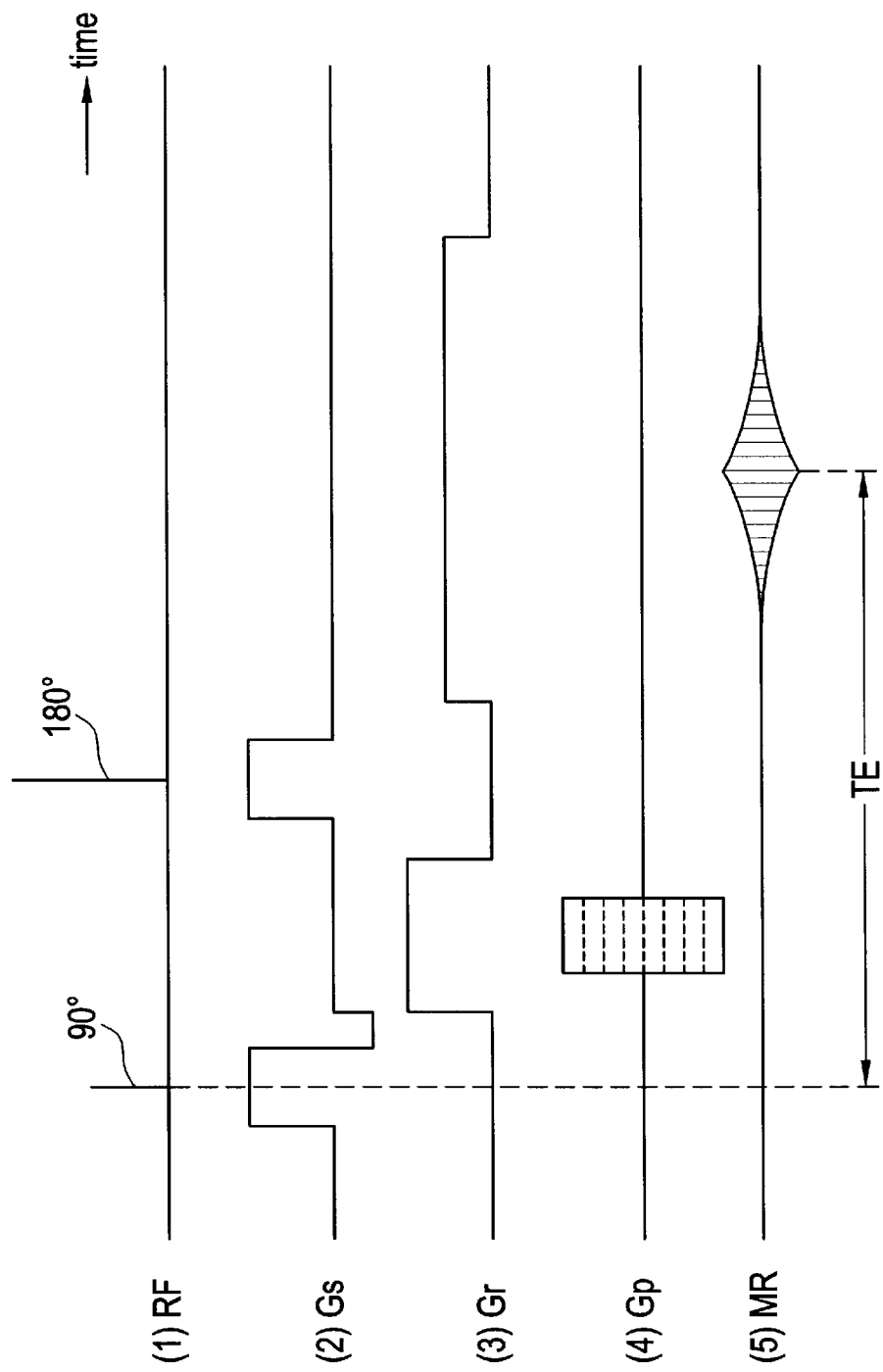
FIG. 2 is a schematic diagram showing an example of a pulse sequence executed by the apparatus in accordance with the embodiment of the present invention.

FIG. 2 shows an exemplary pulse sequence for use in magnetic resonance imaging. The pulse sequence is one according to a spin echo (SE) technique.

Specifically, (1) is a sequence of 90° and 180° pulses for RF excitation of the SE technique; and (2), (3), (4), and (5) are sequences of a slice gradient Gs, readout gradient Gr, phase encoding gradient Gp, and spin echo MR, respectively, of the SE technique. The 90° and 180° pulses are represented by their respective center signals. The pulse sequence proceeds along a time axis t from the left to the right.

As shown, a 90° pulse achieves 90° excitation of the spins. At this time, the slice gradient Gs is applied to perform selective excitation of a certain slice. After a specified time from the 90° excitation, a 180° pulse achieves 180° excitation, i.e., spin inversion. Also at this time, the slice gradient Gs is applied to perform selective excitation of the same slice.

In the period between the 90° excitation and spin inversion, the readout gradient Gr and phase encoding gradient Gp are applied. The readout gradient Gr dephases the spins. The phase encoding gradient Gp phase-encodes the spins.

After the spin inversion, rephasing of the spins is performed by the readout gradient Gr to generate a spin echo MR. The spin echo MR is collected by the data collecting section 150 as view data. Such a pulse sequence is repeated 64–512 times in a cycle TR (repetition time). The phase encoding gradient Gp is changed for each repetition to provide different phase encoding each time. Thus, view data are obtained for 64–512 views.

Figure 3:
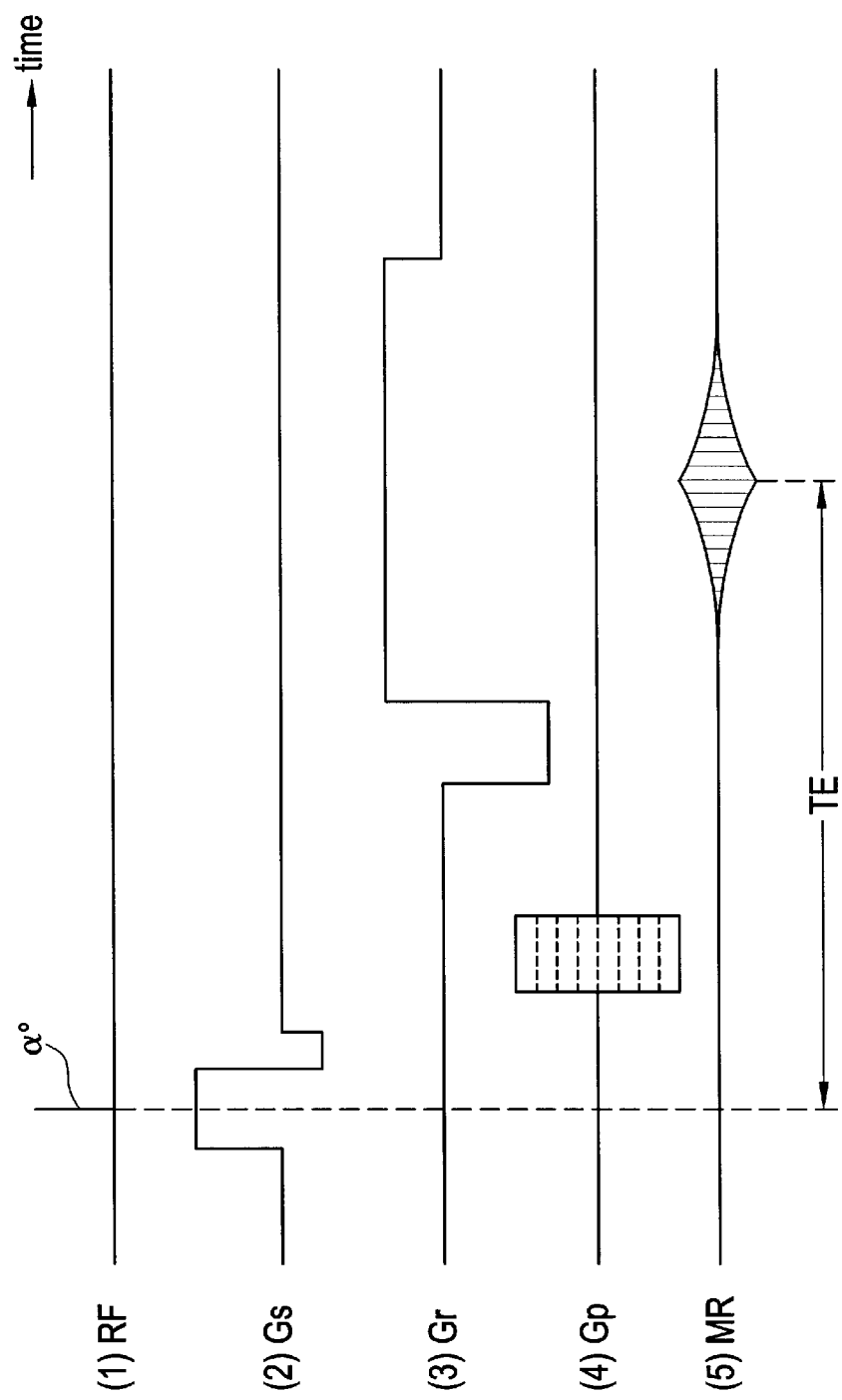
FIG. 3 is a schematic diagram showing another example of a pulse sequence executed by the apparatus in accordance with the embodiment of the present invention.

Another example of the pulse sequence for magnetic resonance imaging is shown in FIG. 3. This pulse sequence is one according to a gradient echo (GRE) technique.

Specifically, (1) is a sequence of an α° pulse for RF excitation of the GRE technique, and (2), (3), (4), and (5) are sequences of a slice gradient Gs, readout gradient Gr, phase encoding gradient Gp, and spin echo MR, respectively, of the GRE technique. It should be noted that the α° pulse is represented by its central signal. The pulse sequence proceeds along a time axis t from the left to the right.

As shown, the α° pulse achieves α° excitation of the spins, wherein α is not greater than 90. At the same time, the slice gradient Gs is applied to achieve selective excitation for a certain slice.

After the α° excitation, the spins are phase-encoded by the phase encoding gradient Gp. Next, the spins are first dephased and are subsequently rephased by the readout gradient Gr to generate a gradient echo MR. The gradient echo MR is collected by the data collecting section 150 as view data. Such a pulse sequence is repeated 64–512 times in a cycle of TR. The phase encoding gradient Gp is changed for each repetition to provide different phase encoding each time. Thus, view data for 64–512 views are obtained.

The view data obtained by the pulse sequence of FIG. 2 or 3 are collected into the memory in the data processing section 170. It will be easily recognized that the pulse sequence is not limited to that of the SE or GRE technique, but may be of any other appropriate technique such as a fast spin echo (FSE) technique or an echo planar imaging (EPI) technique.

Figure 4:
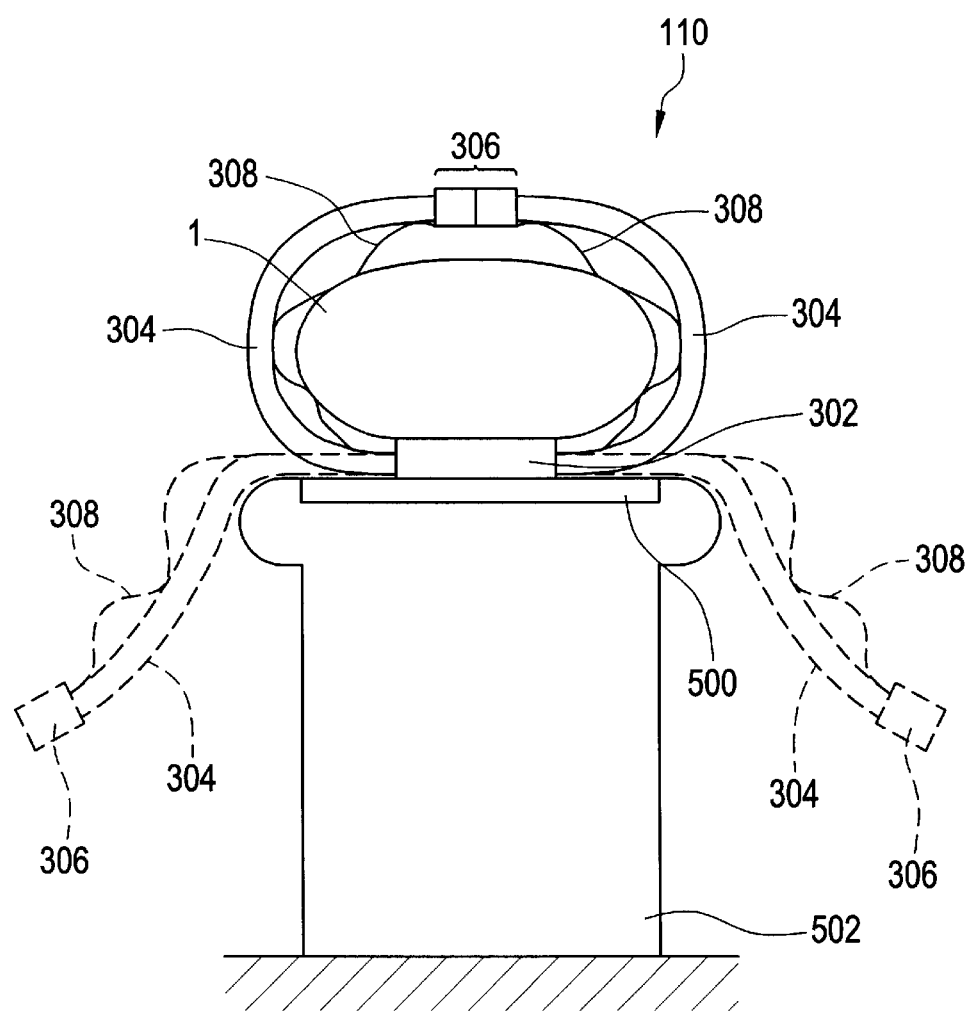
FIG. 4 is a schematic view showing a typical configuration of a receive coil section.

Now the receive coil section 110 will be described. FIG. 4 schematically shows a typical configuration of the receive coil section 110. As shown, the receive coil section 110 has a base portion 302 and a pair of flexible portions 304 attached to opposite lateral sides of the base portion 302. The base portion 302 is an embodiment of the base member of the present invention.

Each side of the base portion 302 is attached with one end of each flexible portion 304 to face the corresponding end of the other. These are fixed ends of the flexible portions 304. The other ends of the flexible portions 304 are free ends. Each free end is attached with one of a pair of units of a connector 306. The connector 306 is an embodiment of the coupling member of the present invention.

The base portion 302 is placed on the cradle 500. The cradle 500 is mounted on a table 502. The cradle 500 can be moved forward/backward in a direction perpendicular to the drawing plane of FIG. 4.

The free ends of the flexible portions 304 are coupled by the connector 306 to form a cylinder along with the base portion 302. The cylinder is an embodiment of the cylinder of the present invention. When the connector 306 is disconnected, the receive coil section 110 is unfolded in a sheet-like form, and the flexible portions 304 hang down on opposite sides of the table 502, as indicated by broken lines.

A side of the flexible portions 304 that corresponds to the inner side of the cylinder is provided with a pair of handhold members 308. Each handhold member 308 is a flexible elongated member with the ends fixed to the base portion 302 and connector 306. The handhold member 308 has a length slightly longer than that of the flexible portion 304. The difference of the lengths is exaggerated in the drawings. The handhold member 308 is an embodiment of the handhold member of the present invention.

Figure 5:
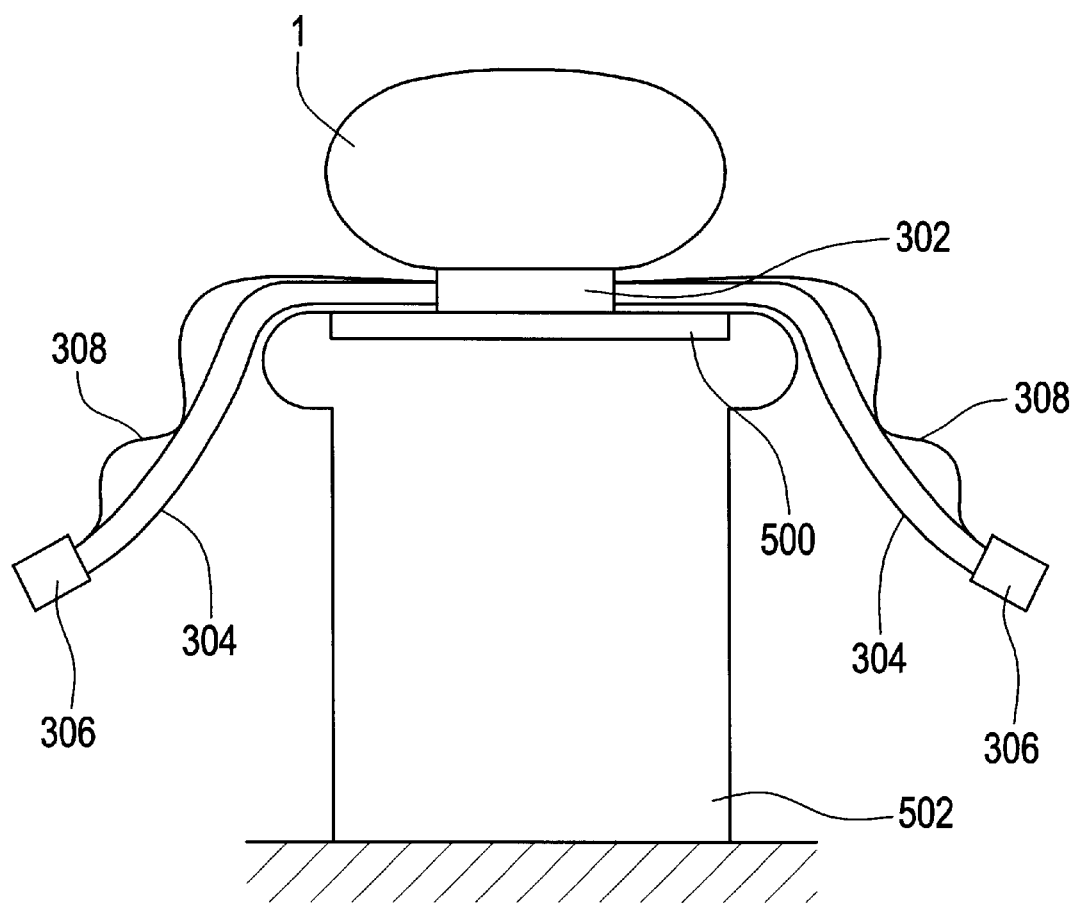
FIG. 5 is a view showing a procedure for wrapping a subject to be imaged by the receive coil section.

The subject 1 is rested over the cradle 500 at a holding position of the cradle 500 with the flexible portions 304 hanging down on opposite sides of the table 502 as shown in FIG. 5. It should be noted that at the portion where the flexible portions 304 are in contact with the flexible portion 304, they just contact each other. After the subject 1 has been rested, the flexible portions 304 are wrapped around the subject 1 from opposite sides.

Figure 6:
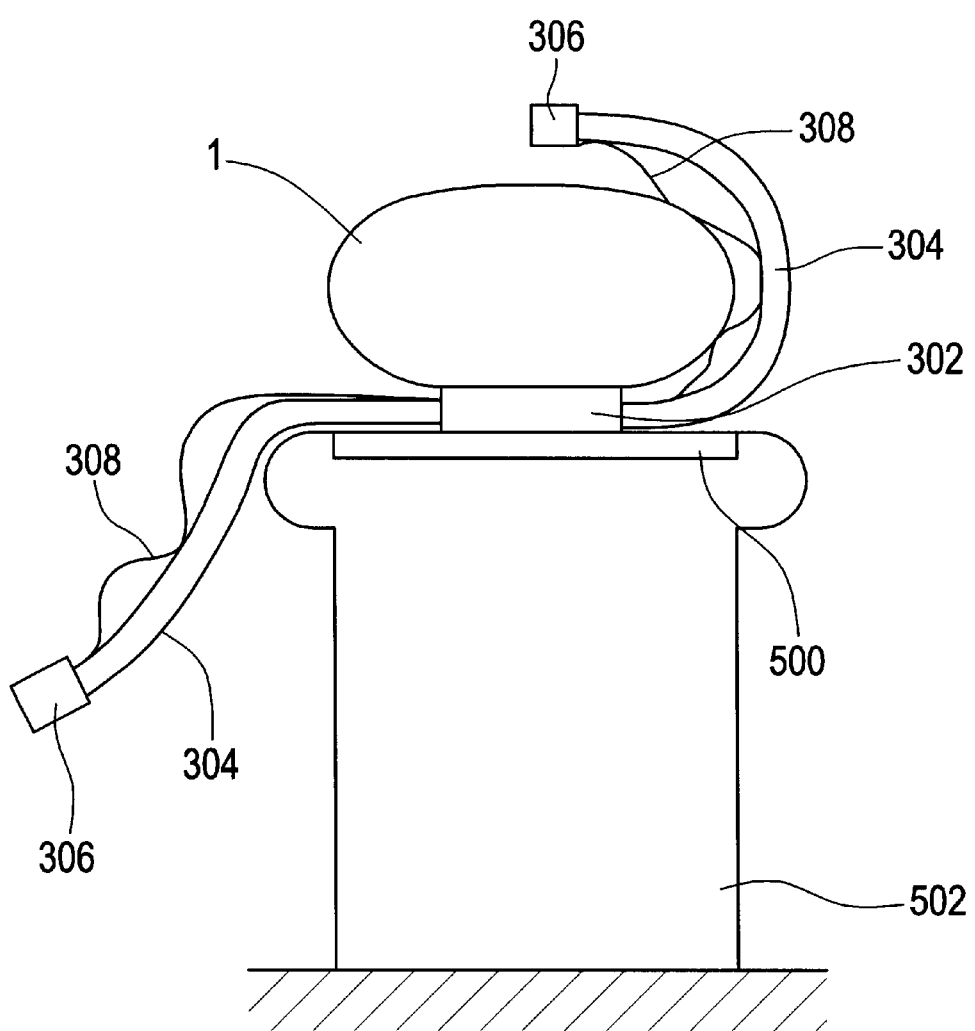
FIG. 6 is a view showing the procedure for wrapping the subject to be imaged by the receive coil section.

If this work is done by the operator standing on the right side of the table 502, the operator first lifts the free end of the flexible portion 304 on the right side, and brings it over the subject 1. Thus, the relationship between the subject 1 and the receive coil section 110 becomes that shown in FIG. 6.

Figure 7:
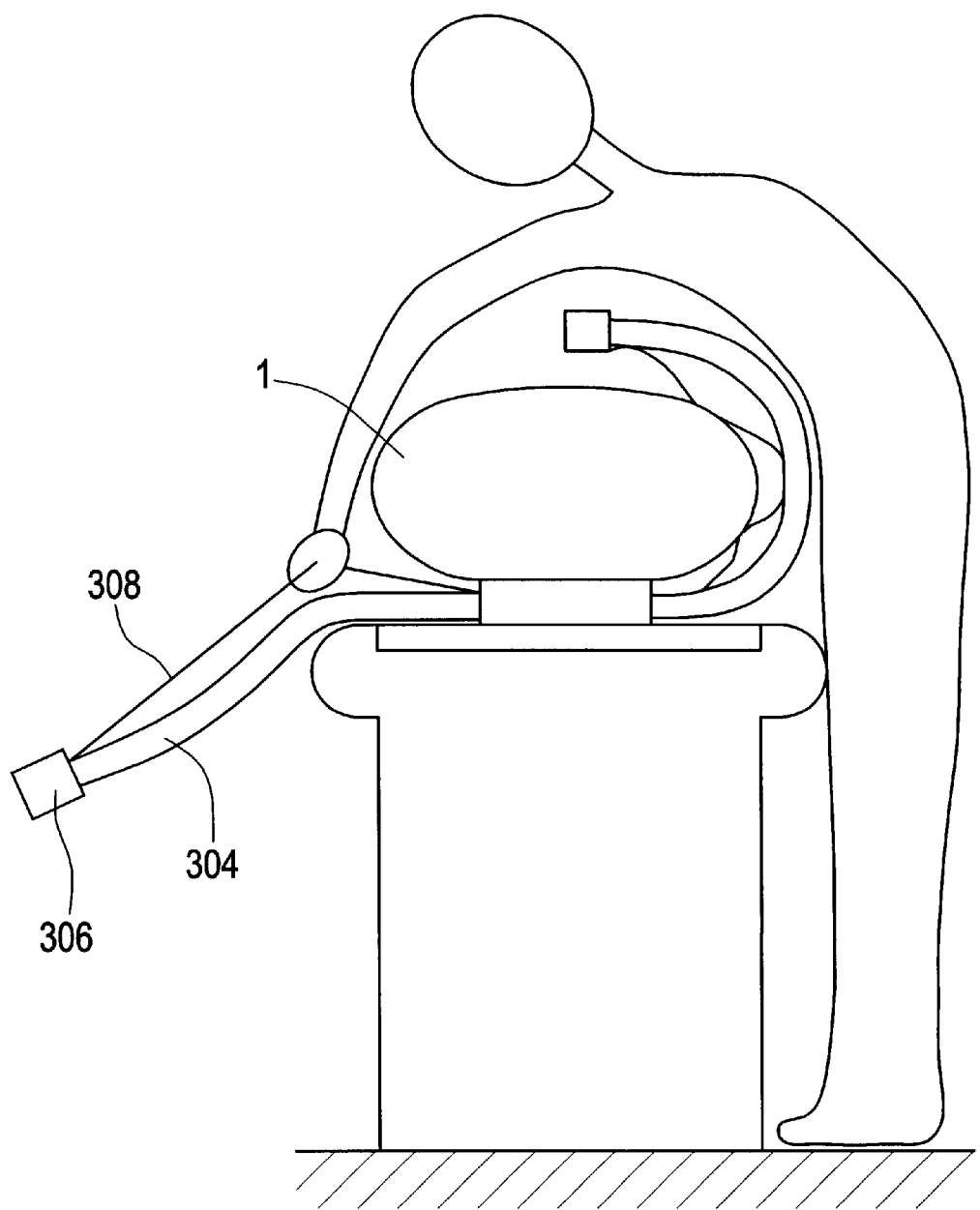
FIG. 7 is a view showing the procedure for wrapping the subject to be imaged by the receive coil section.

Next, the operator stretches his/her arm over the subject 1 toward the opposite side of the table 502, grasps and lifts the handhold member 308 on the flexible portion 304 on the opposite side, i.e., the left side, as shown in FIG. 7. The operator then draws up the handhold member 308 to lift the free end of the flexible portion 304 on the left side over the subject 1.

At that time, the force for lifting the flexible portion 304 up is applied only to the free end. Since the free end is the tip of the flexible portion 304 and the free end is lifted up using the handhold member 308, it can be easily lifted up.

That is, unlike in the prior art, no stress is ever concentratedly applied to the proximal portion of the flexible portion 304, and the lifting up can be done with good workability by using the handhold member 308. While the above description is made on a case in which the operator works on the right side of the table 502, the same applies to a case in which the operator works on the left side except that the right and left are interchanged.

Figure 8:
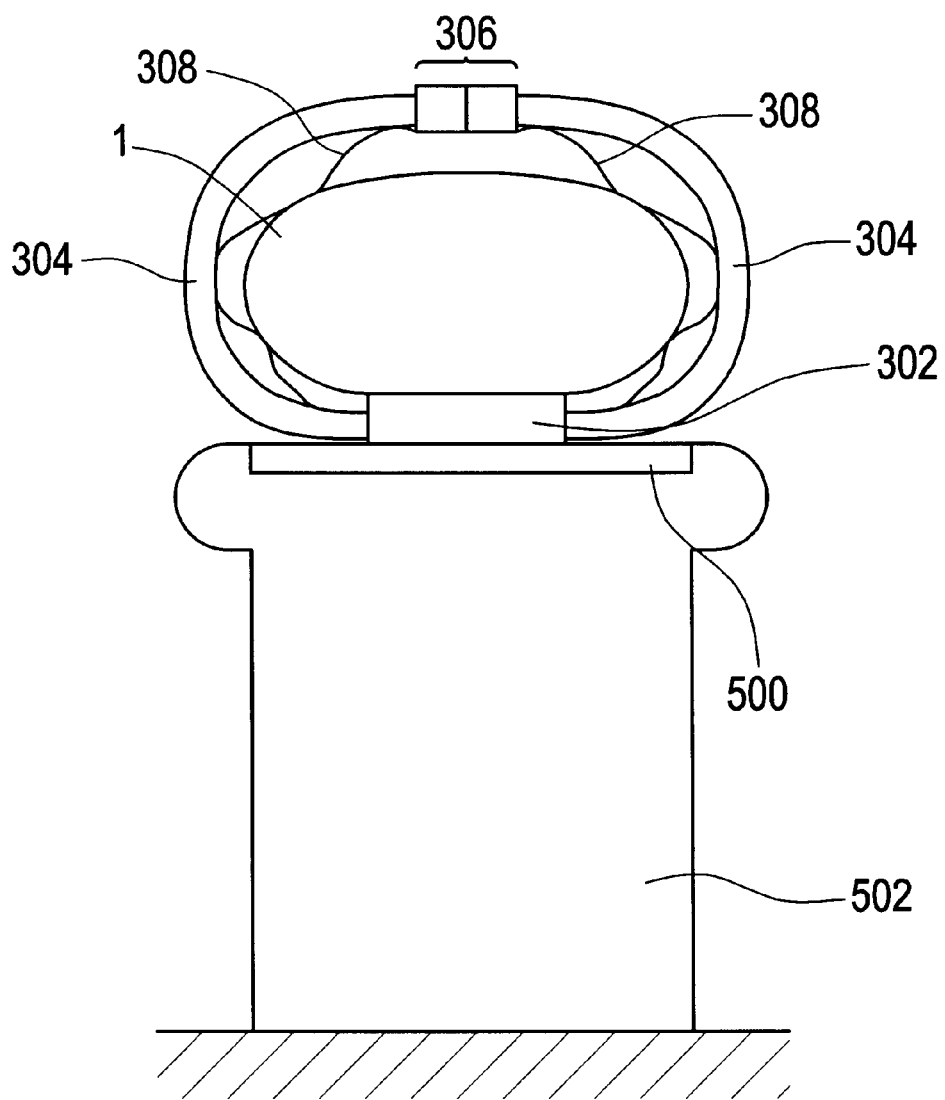
FIG. 8 is a view showing the procedure for wrapping the subject to be imaged by the receive coil section.

Thereafter, the free ends of the flexible portions 304 are coupled using the connectors 306 to form the cylinder wrapping around the subject 1, as shown in FIG. 8. Under this condition, the cradle 500 is moved to carry the subject 1 into the static magnetic field space, and imaging is conducted. After the imaging, the cradle 500 is restored to the holding position, the connector 306 is disconnected to unfold the receive coil portion 110, and the subject 1 is discharged from the cradle 500.

Figure 9:
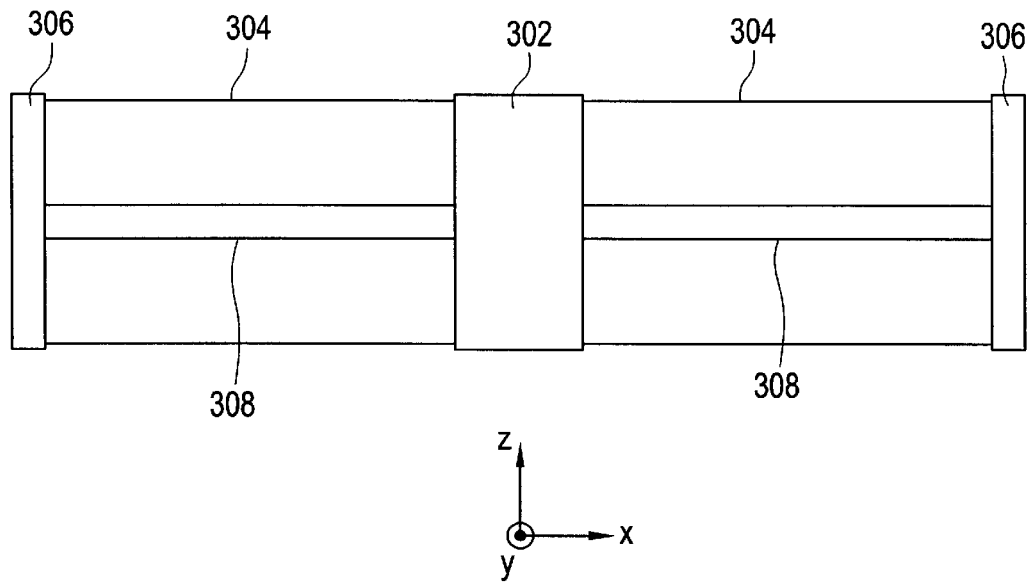
FIG. 9 is a development of the receive coil section.

FIG. 9 shows the receive coil section 110 unfolded into a plane. As shown, the opposite ends of each handhold member 308 are fixed at the central portion of the base portion 302 and the associated connector unit 306. Thus, the lifting-up of the free end of the flexible portion 304 is done in good balance.

Figure 10:
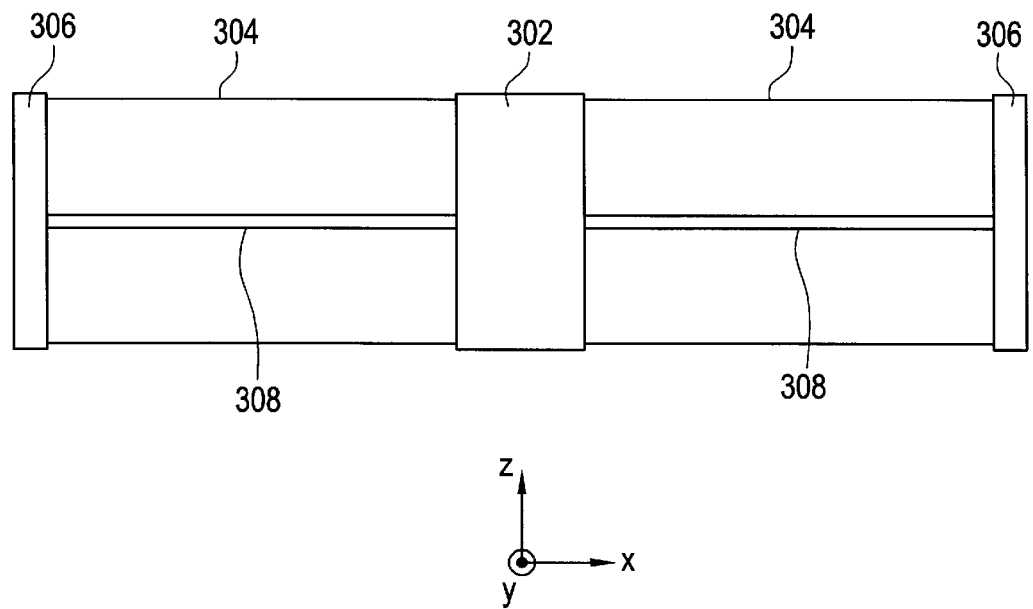
FIG. 10 is a development of the receive coil section.
Figure 11:
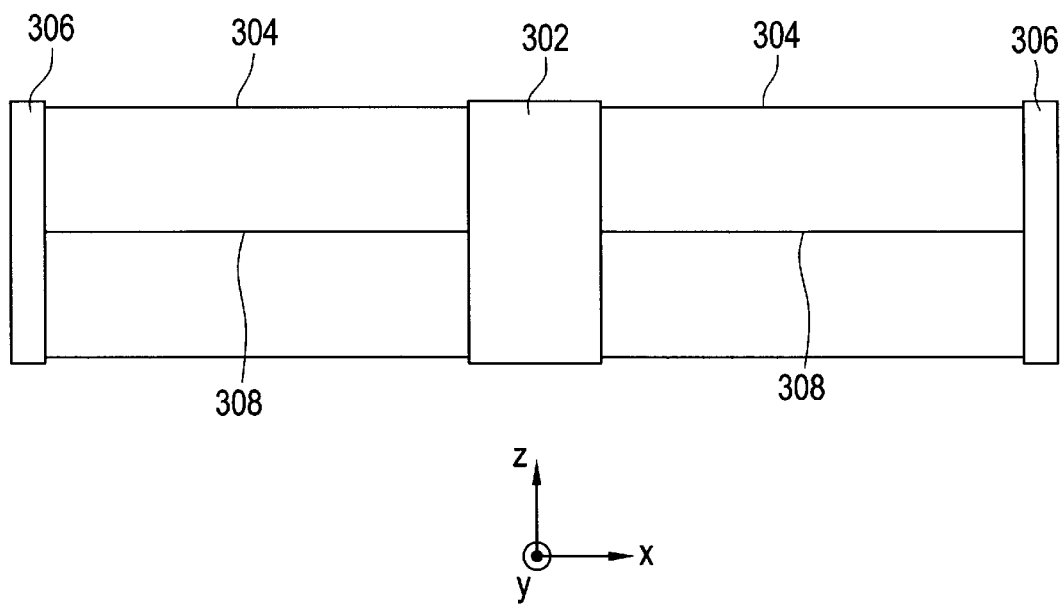
FIG. 11 is a development of the receive coil section.
Figure 12:
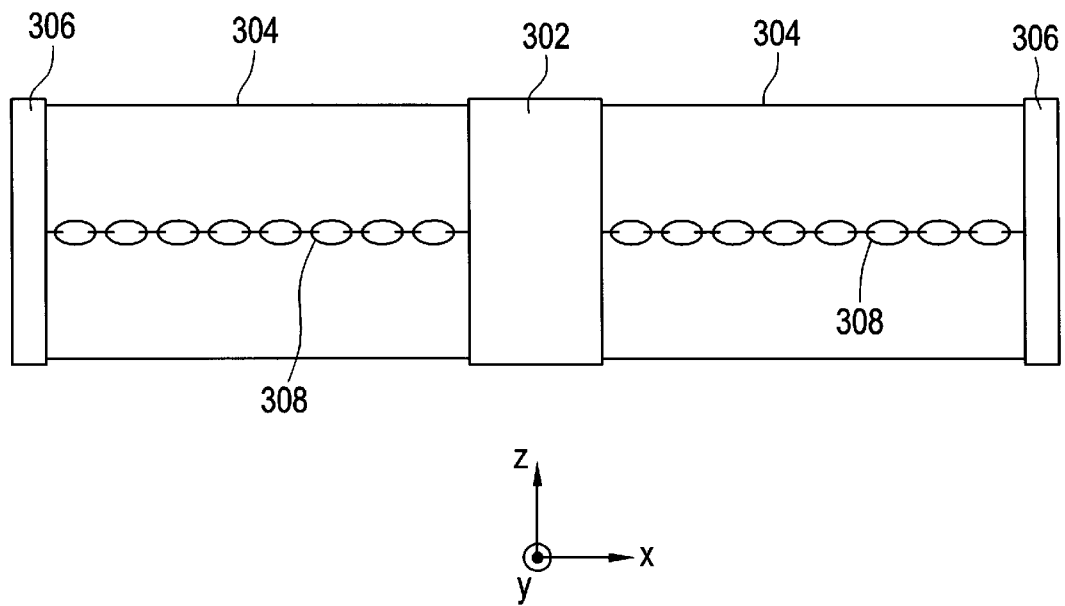
FIG. 12 is a development of the receive coil section.

The handhold member 308 is made using a band-like element of, for example, a fabric. The band-like handhold member 308 offers an advantage of dispersing the weight applied to the operator's hand. Moreover, such a member 308 is thin and it does not occupy a large space in the interior of the RF coil. Alternatively, the handhold member 308 may be a cord-like element as shown in FIG. 10. This reduces the usage of material as compared with the band-like element. It should be noted that the cord-like element is depicted by its outline as two lines. Moreover, if the handhold member 308 is made by a string-like element as shown in FIG. 11, the usage of material is further reduced. Furthermore, when a chain-like handhold member 308 is employed as shown in FIG. 12, the stoutness can be improved.

Figure 13:
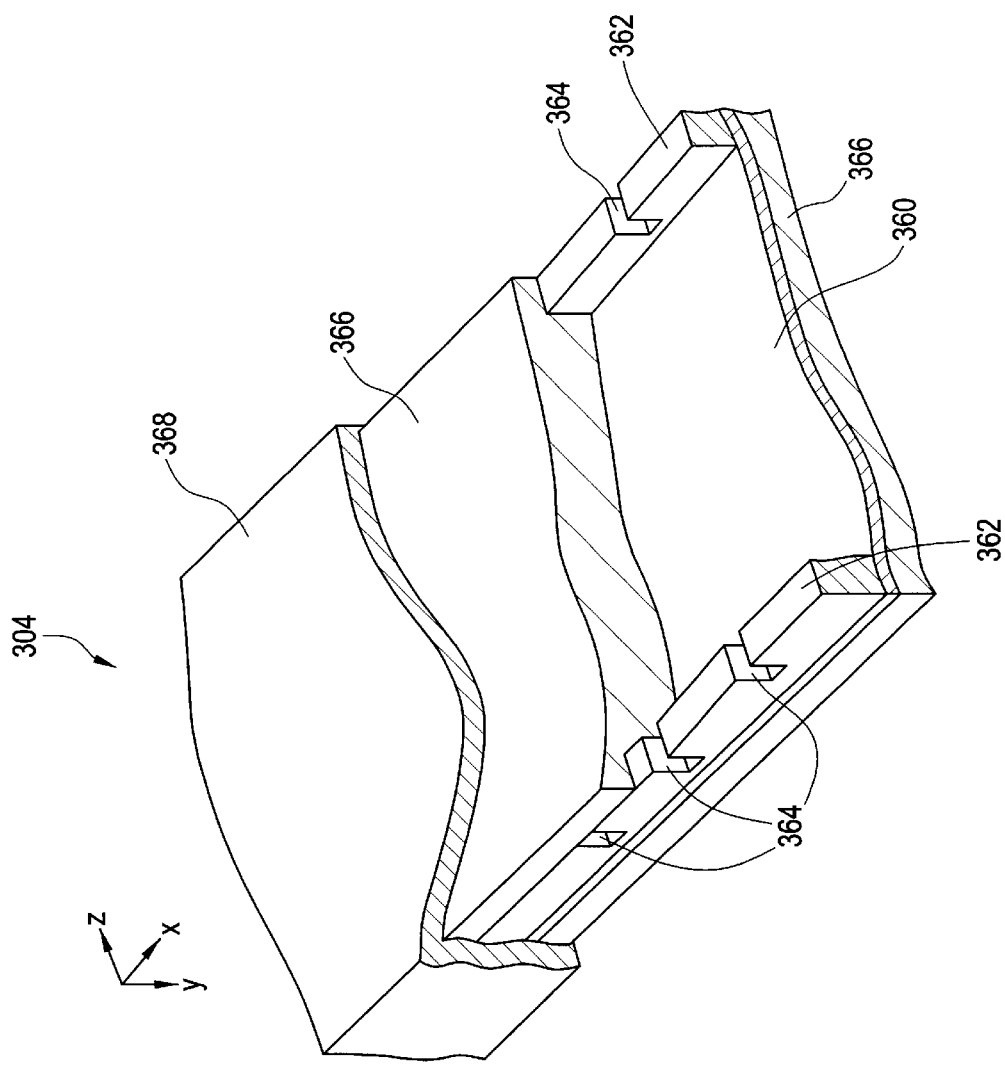
FIG. 13 is a broken-away view showing part of the configuration of the receive coil section.

In the drawings, x, y, and z represent three coordinate axes orthogonal to one another. The x-direction is defined as the right-left direction, the y-direction as the upper-lower direction, and the z-direction as the axial direction, of the receive coil section 110. In this condition, the internal structure of the flexible portion 304 is shown in FIG. 13 in the partially broken-away view. It should be noted that in FIG. 13 the vertical dimension is exaggerated for convenience of illustration.

Figure 14A:
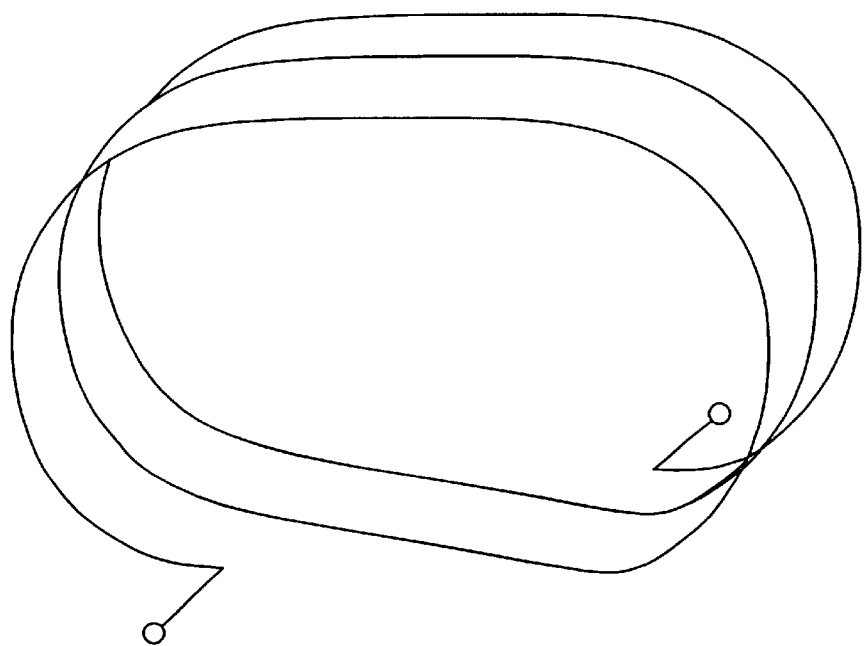
FIG. 14 shows electric circuit diagrams of the receive coil section.
Figure 14B:
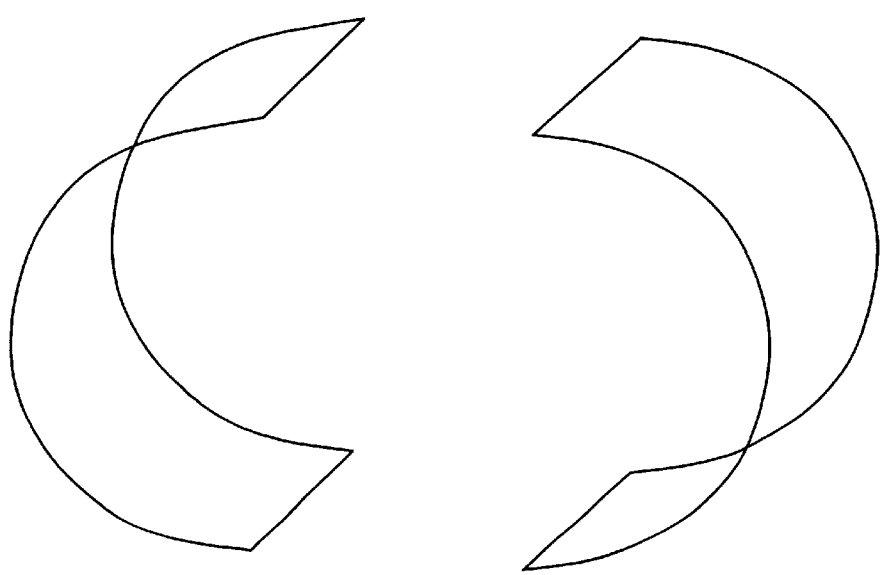

As shown in FIG. 13, the flexible portion 304 comprises a flexible substrate 360. The flexible substrate 360 is an embodiment of the flexible substrate of the present invention. The flexible substrate 360 is provided with an electric circuit pattern (not shown), which may be formed as a printed circuit, for example. When the cylinder is formed, the electric circuit constitutes a solenoid coil as shown in FIG. 14(a) or a saddle coil as shown in FIG. 14(b), for example. Each electric circuit is an embodiment of the electric circuit for the RF coil of the present invention.

The edges of the upper surface of the flexible substrate 360 are provided with a pair of shape defining members 362 over the length of the flexible substrate 360. The upper surface of the flexible substrate 360 corresponds to the inner side when the cylinder is formed. The shape defining members 362 are made of a plastic material, for example. The shape defining members 362 represent an embodiment of the shape defining member of the present invention.

The shape defining members 362 have a predefined thickness in the y-direction such that flexibility is substantially avoided. The shape defining members 362 have a plurality of U-shaped notches 364. The notches 364 are cut in the z-direction and open upwards.

The notches 364 have a depth approximately equal to the thickness of the shape defining member 362. Thus, the thickness of the notch 364 at the bottom is extremely reduced to obtain sufficient flexibility. Alternatively, the thickness at the bottom may be zero.

Figure 15:
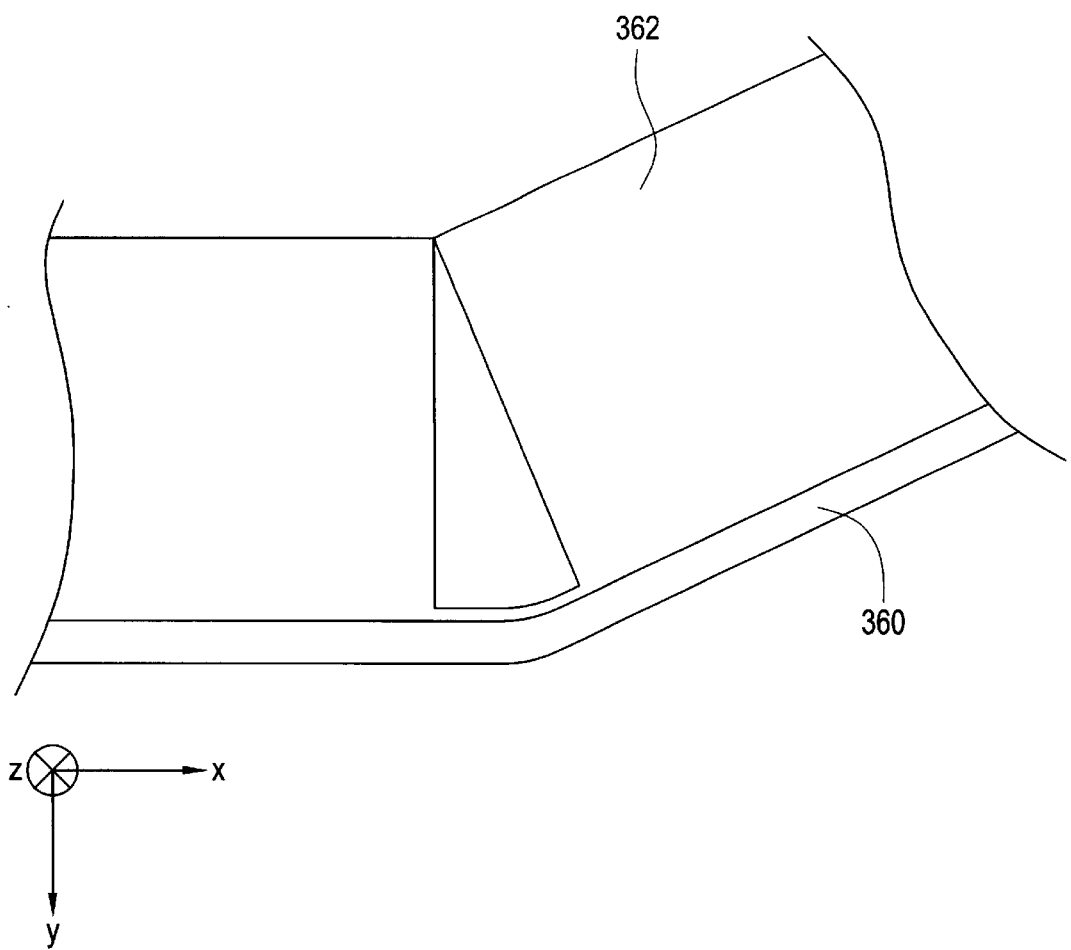
FIG. 15 is a diagram for explaining the function of a shape defining member in the receive coil section.

Such shape defining members 362 allow the flexible substrate 360 to bend only at the flexible portions of the shape defining members 362 (i.e., at the bottom of the notches) when the flexible substrate 360 is curved in a direction of forming a cylinder, and the bending amount is limited to that at which the openings of the notches 364 close, as schematically shown in FIG. 15. The allowable bending amount is determined by the width of the notches, i.e., the wider the width of the notches, the larger is the bending allowance range.

Figure 16:
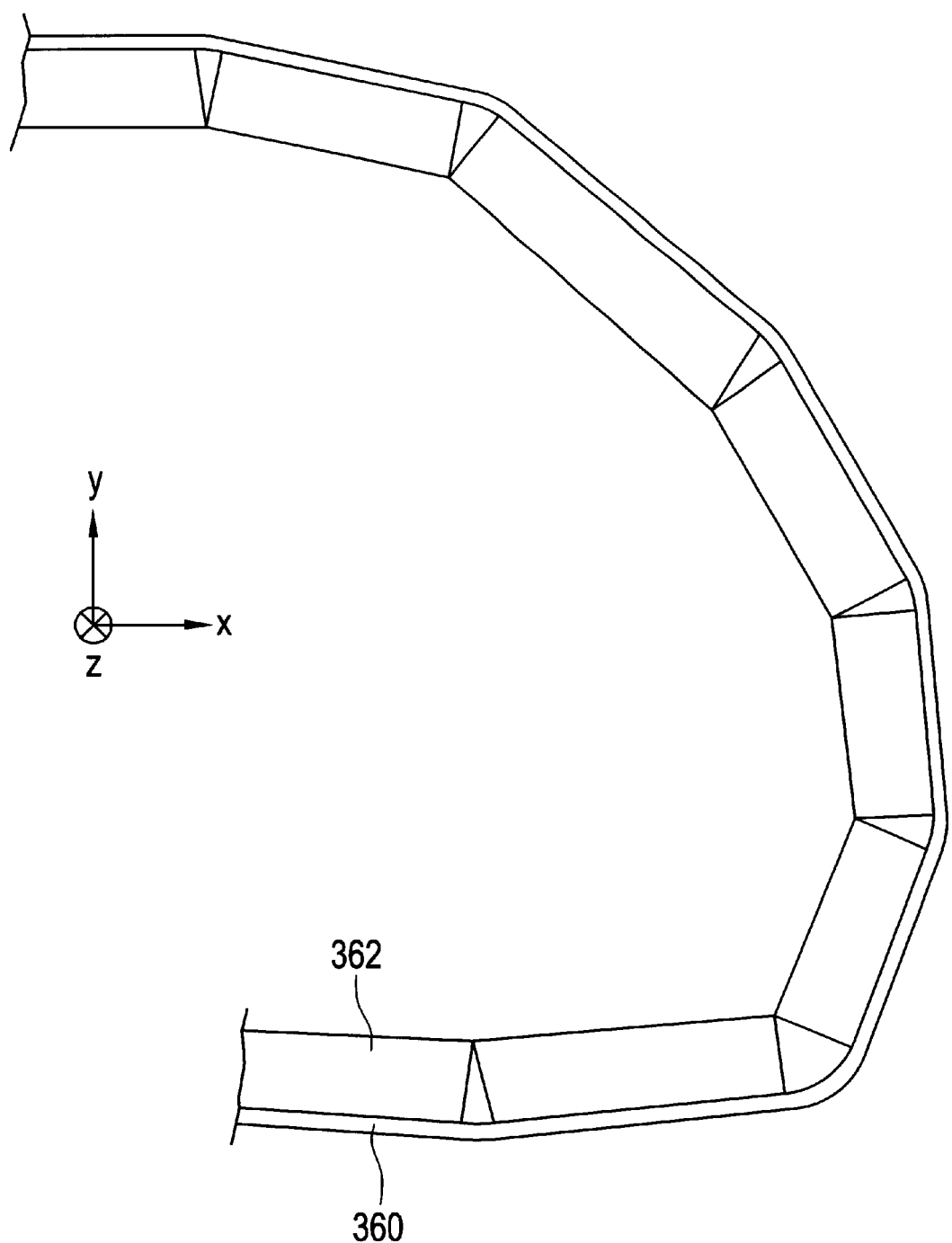
FIG. 16 is a diagram for explaining the function of the shape defining member in the receive coil section.

The width and the spacing in the x-direction of the notches 364 are determined according to the bending amount of every portion of the flexible substrate 360 in forming the cylinder. Thus, bending of the flexible substrate 360 as exemplarily and schematically shown in FIG. 16 is obtained when the cylinder is formed. Although only the right portion is shown in FIG. 16, the left portion is symmetric with the right portion.

Such bending uniquely defines a curved shape of the cylinder, or the receive coil section 110. By fixing the curved shape, the electromagnetic condition of the receive coil section 110 is fixed, thereby enabling stable imaging.

Over the shape defining member 362 and the flexible substrate 360 is provided a shock absorbing member 366 of sponge, for example. A similar shock absorbing member 366 is provided on the lower surface of the flexible substrate 360.

All the above structures are enclosed in an envelope 368. The envelope 368 is fixed to the base portion 302 at an end on the fixed end side of the flexible portion 304, and the end on the free end side is fixed to the connector 306. The fixing of the both ends is achieved by any appropriate means such as bonding, nipping, riveting, or sewing. Alternatively, use of joining means utilizing entanglement of fibrous shag that can be easily stuck and unstuck is preferable in that the fixing means can be simplified. The envelope 368 is an embodiment of the sheet member of the present invention.

The envelope 368 is made from a sheet of a material that resists tension and has small elongation. As the sheet material, a fabric is employed, for example. A fabric is preferable in that it is flexible and soft to the touch. Among fabrics, one woven from yarn such as synthetic fiber with a high tensile strength is preferable so that it can resist a high tension. A fabric made from a plurality of laminated layers may be employed if needed.

The receive coil section 110 having such a configuration is placed on the cradle 500 with its free ends coupled via the connector 306. If the electric circuit pattern of the receive coil section 110 is a saddle coil pattern, joining means utilizing entanglement of fibrous shag that can be easily stuck and unstuck may be used in lieu of the connector 306 because electrical connection is not needed between the free ends.

While the present invention has been described with reference to preferred embodiments hereinabove, various changes or substitutions may be made on these embodiments by those ordinarily skilled in the art pertinent to the present invention without departing from the technical scope of the present invention. Therefore, the technical scope of the present invention encompasses not only those embodiments described above but all that fall within the scope of the appended claims.

Many widely different embodiments of the invention may be constructed without departing from the spirit and the scope of the present invention. It should be understood that the present invention is not limited to the specific embodiments described in the specification, except as defined in the appended claims.

What is claimed is:

1. An RF coil comprising:

a base member;

a pair of flexible substrates each having an electric circuit for the RF coil, one end of each flexible substrate being attached to a lateral side of said base member, the other ends of the flexible substrates being coupled to each other via a coupling member to form a cylinder;

a shape defining member attached to a side of said pair of flexible substrates that corresponds to an inner side of said cylinder, for defining a curved shape of said pair of flexible substrates when said cylinder is formed; and a pair of handhold members each provided along a side that corresponds to an inner side of said shape defining member in said cylinder, each handhold member extending from one end to the other end of one of said pair of flexible substrates.

2. The RF coil of claim 1, wherein said handhold member is an elongated flexible element with one end fixed to one end of said flexible substrate and the other end fixed to the other end of said flexible substrate.

3. The RF coil of claim 1, wherein said handhold member has one end fixed to a central portion of one end of said flexible substrate and the other end fixed to a central portion of the other end of said flexible substrate.

4. The RF coil of claim 1, wherein said handhold member of said flexible element has a length greater than the length of said flexible substrate.

5. The RF coil of claim 1, wherein said handhold member is a band-like element.

6. The RF coil of claim 1, wherein said handhold member is a cord-like element.

7. The RF coil of claim 1, wherein said handhold member is a string-like element.

8. The RF coil of claim 1, wherein said handhold member is a chain-like element.

9. An RF coil comprising:

a base member;

a pair of flexible substrates each having an electric circuit for the RF coil, one end of each flexible substrate being attached to a lateral side of said base member, the other ends of the flexible substrates being coupled to each other via a coupling member to form a cylinder;

a shape defining member attached to a side of said pair of flexible substrates that corresponds to an inner side of said cylinder, for defining a curved shape of said pair of flexible substrates when said cylinder is formed;

a sheet member provided along a side that corresponds to an inner side of said shape defining member in said cylinder, extending from one end to the other end of each of said pair of flexible substrates; and a pair of handhold members each provided along a side that corresponds to an inner side of said sheet member in said cylinder, each handhold member extending from one end to the other end of one of said pair of flexible substrates.

10. The RF coil of claim 9, wherein said handhold member is an elongated flexible element with one end fixed to one end of said flexible substrate and the other end fixed to the other end of said flexible substrate.

11. The RF coil of claim 9, wherein said handhold member has one end fixed to a central portion of one end of said flexible substrate and the other end fixed to a central portion of the other end of said flexible substrate.

12. The RF coil of claim 9, wherein said handhold member of said flexible element has a length greater than the length of said flexible substrate.

13. The RF coil of claim 9, wherein said handhold member is a band-like element.

14. The RF coil of claim 9, wherein said handhold member is a cord-like element.

15. The RF coil of claim 9, wherein said handhold member is a string-like element.

16. The RF coil of claim 9, wherein said handhold member is a chain-like element.

17. A magnetic resonance imaging apparatus having:

a static magnetic field generating device for generating a static magnetic field in a space for receiving a subject to be imaged, a gradient magnetic field generating device for generating a gradient magnetic field in said space, a high frequency magnetic field generating device for generating a high frequency magnetic field in said space, a measuring device for measuring magnetic resonance signals from said subject, and an image producing device for producing an image based on said magnetic resonance signals, wherein said measuring device has an RF coil, said RF coil comprising:

a base member;

a pair of flexible substrates each having an electric circuit for the RF coil, one end of each flexible substrate being attached to a lateral side of said base member, the other ends of the flexible substrates being coupled to each other via a coupling member to form a cylinder;

a shape defining member attached to a side of said pair of flexible substrates that corresponds to an inner side of said cylinder, for defining a curved shape of said pair of flexible substrates when said cylinder is formed; and a pair of handhold members each provided along a side that corresponds to an inner side of said shape defining member in said cylinder, each handhold member extending from one end to the other end of one of said pair of flexible substrates.

18. The magnetic resonance imaging apparatus of claim 17, wherein said handhold member is an elongated flexible element with one end fixed to one end of said flexible substrate and the other end fixed to the other end of said flexible substrate.

19. The magnetic resonance imaging apparatus of claim 17, wherein said handhold member has one end fixed to a central portion of one end of said flexible substrate and the other end fixed to a central portion of the other end of said flexible substrate.

20. The magnetic resonance imaging apparatus of claim 17, wherein said handhold member of said flexible element has a length greater than the length of said flexible substrate.

21. The magnetic resonance imaging apparatus of claim 17, wherein said handhold member is a band-like element.

22. The magnetic resonance imaging apparatus of claim 17, wherein said handhold member is a cord-like element.

23. The magnetic resonance imaging apparatus of claim 17, wherein said handhold member is a string-like element.

24. The magnetic resonance imaging apparatus of claim 17, wherein said handhold member is a chain-like element.

* * * * *